(12) United States Patent
Nagata

(10) Patent No.: US 7,407,855 B2
(45) Date of Patent: Aug. 5, 2008

(54) METHOD OF PRODUCING SEMICONDUCTOR ELEMENT AND NONVOLATILE SEMICONDUCTOR MEMORY PRODUCED BY THIS METHOD

(75) Inventor: Toshio Nagata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 7 days.

(21) Appl. No.: 11/202,190

(22) Filed: Aug. 12, 2005

(65) Prior Publication Data

US 2007/0004155 A1    Jan. 4, 2007

Related U.S. Application Data

(62) Division of application No. 10/254,646, filed on Sep. 26, 2002, now Pat. No. 6,953,966.

(30) Foreign Application Priority Data

Jan. 31, 2002    (JP)    ............... 2002-023286

(51) Int. Cl.
*H01L 21/28* (2006.01)
(52) U.S. Cl. .............. 438/257; 257/E21.179
(58) Field of Classification Search ........ 438/201, 438/261, 263; 257/E29.042, E21.179
See application file for complete search history.

(56) References Cited

U.S. PATENT DOCUMENTS

| 5,067,108 | A | 11/1991 | Jenq |
| 5,505,779 | A * | 4/1996 | Mizuno et al. ........... 118/719 |
| 6,136,652 | A * | 10/2000 | Hazani ..................... 438/260 |
| 6,184,088 | B1 | 2/2001 | Kurooka et al. |
| 6,229,176 | B1 | 5/2001 | Hsieh et al. |
| 6,277,686 | B1 | 8/2001 | Yeh et al. |
| 6,307,770 | B1 | 10/2001 | Oya |
| 6,339,000 | B1 | 1/2002 | Bhattacharya et al. |
| 6,429,073 | B1 | 8/2002 | Furuhata et al. |
| 6,579,764 | B2 | 6/2003 | Kuwazawa |
| RE38,370 | E | 12/2003 | Vasche |
| 6,812,519 | B2 | 11/2004 | Furuhata |
| 2002/0061619 | A1 | 5/2002 | Yamada |
| 2002/0137289 | A1 | 9/2002 | Chang |

FOREIGN PATENT DOCUMENTS

| JP | 03066172 | 3/1991 |
| JP | 08-236647 | 9/1996 |
| JP | 11-040681 | 2/1999 |
| JP | 2001053172 | 2/2001 |

* cited by examiner

*Primary Examiner*—Carl Whitehead, Jr.
*Assistant Examiner*—Jennifer M Dolan
(74) *Attorney, Agent, or Firm*—Volentine & Whitt, P.L.L.C.

(57) ABSTRACT

In a first embodiment, Tetraethyl Orthosilicate Si(OC2H5)4 is used at the process temperature of 650° C.±5° C. as film forming material, to decrease crystal defects occurring during deposition. In a second embodiment, annealing is carried out in sparse oxygen gas atmosphere after deposition, to mend crystal defects that occurred during deposition. In a third embodiment, initial temperature of the CVD device is kept at about 400° C., whereby the start of natural oxidation of the deposition surface is prevented and production circumstances of the semiconductor element is not deteriorated. Then, the CVD device is heated up to CVD temperature of about 750° C. or about 650° C., to deposit oxide.

3 Claims, 8 Drawing Sheets

METHOD OF PRODUCING SEMICONDUCTOR ELEMENT AND NONVOLATILE SEMICONDUCTOR MEMORY PRODUCED BY THIS METHOD

CROSS REFERENCE TO RELATED APPLICATIONS

This is a divisional application of application Ser. No. 10/254,646, filed Sep. 26, 2002, now U.S. Pat. No. 6,953,966, which is hereby incorporated by reference in its entirety for all purposes.

BACKGROUND OF THE INVENTION

1. Field of the Invention

The present invention relates to a method of producing semiconductor element which is able to enhance the dielectric strength of the insulation film such as a tunnel oxide film of nonvolatile semiconductor memory, and the same memory produced by this method.

2. Description of Related Art

To begin with, giving brief description about nonvolatile semiconductor memory which is the background of the present invention: as shown in FIG. 10 and FIG. 11, this kind of memory is able to memorize one bit of data by accumulating a group of electrons in a floating gate 9. According to FIG. 10, when data is written in the memory, the gate is impressed with a voltage. Thus, the channel is opened. And hot electrons come out of the channel. And these electrons are accumulated in the floating gate 9. On the other hand, as shown in FIG. 11, when data in the memory is erased, the source is impressed with a voltage in stead of the gate. Thus, the electrons accumulated in the floating gate 9 is let out by tunnel current from the floating gate 9 to the control gate 11. In this operation, as shown in FIG. 11, the tunnel current flows through a sharp portion of the floating gate 9 (see e.g. U.S. Pat. No. 5,067,108 Jenq).

Tunnel oxide film of this kind of semiconductor memory is a very thin dielectric with thickness of less than 100 angstroms (c.f. Jenq). As an actual method to form this kind of thin film, there is a chemical vapor deposition (CVD) which uses mixture gas of SiH4 and N2O. The conditions of film forming are the temperature 750° C., the pressure 0.45 Torr, and the atmosphere SiH4:N2O=24:1200 cc. And after film forming, the film formed is annealed. The conditions of annealing are the temperature 1000° C., the atmosphere N2, and the process time 30 seconds.

In the semiconductor memory mentioned above, it is necessary to keep the dielectric strength of the very thin tunnel oxide film in high level. Otherwise, the electrons which should be kept in the floating gate 9 become likely to leak to the control gate 11 through the sharp portion of the thin film shown in FIG. 11. Even if the source is not impressed with the high voltage.

Accordingly the inventor of the present invention tested the dielectric strength of the sample of tunnel oxide film which was formed with the conventional method. The result is shown in FIG. 9. The method of the test is to prepare a sample of prescribed thickness and sectional area. This sample is impressed with a voltage at the thickness. The voltage is gradually increased. Then the leak current is detected. And a sample of thermal oxide film was tested with the same method. Both of the leak currents were compared. Then the dielectric strength of the CVD tunnel oxide film was evaluated under the standard of the thermal oxide film.

Both results of the test of these samples are shown in FIG. 9. Samples which thickness is about 100 angstroms were prepared for both of conventional CVD oxide film and thermal oxide film. And the voltage impressed at thickness of each sample is increased from 0V. Then the next phenomena appeared. About the conventional CVD oxide film, when the voltage was 10V, a leak current of 1.E-12A flowed. So the dielectric began to be broken at this moment. And the strength of the electric field that is the dielectric strength at this moment was 10V÷100 Å=10 MV/cm. On the other hand, about the thermal oxide film, when the voltage was 12V, a leak current of 1.E-12A flowed. So the dielectric began to be broken at this moment. And the strength of the electric field that is the dielectric strength at this moment was 12V÷100 Å=12 MV/cm. As a next step, about the conventional CVD oxide film, when the voltage was 12V, a leak current of 1.E-10A flowed. A current of CVD oxide film flowed at the voltage of 12V was 100 times larger than that of thermal oxide film at same voltage. After this, each voltage impressed to both samples was increased. Then each current flowed as represented in the characteristic curve in FIG. 9. As shown in FIG. 9, the characteristic curves of the voltage versus current have similar figures about both kinds of samples. And it has been revealed that the average current of CVD oxide film which flows at each voltage is some 10 times larger than that of thermal oxide film. In addition, the vertical coordinate in FIG. 9 has a logarithmic scale. By this method, testing samples of oxide film, the tunnel oxide film which dielectric strength is near to that of thermal oxide film is obtained. And the subject of this invention is to obtain tunnel oxide film which dielectric strength is as high as possible.

SUMMARY OF THE INVENTION

Therefore the present invention aimed at providing a method of producing semiconductor element which tunnel oxide film has dielectric strength near to thermal oxide film, and providing a nonvolatile semiconductor memory produced by this method.

According to one aspect of the present invention, there is provided three kinds of method. The first is a method to use a silicon compound called tetra-ethyl ortho-silicate as a material of film forming by CVD. The chemical formula is Si(OC2H5)4. The film forming condition in the process of forming tunnel oxide film is that the temperature range is 650° C.±10° C. In this condition, the uniformity of the surface of the semiconductor film is kept and a thin film less than 200 Å is formed in a stable condition. So this compound is suitable for forming CVD tunnel oxide film under this condition. This method is a process of a method of producing a semiconductor element such as a nonvolatile semiconductor memory.

The second is a method to anneal CVD tunnel oxide film in a sparse oxygen atmosphere. And the third is a method of keeping initial temperature of the chemical vapor deposition device in the range where natural oxidation of the surface of the floating gate is able to be restrained and the production circumstance is not ruined. And after heating up to the chemical vapor deposition temperature, the silicon substrate with the floating gate is transferred there. Each of these methods is also a process of a method of producing a semiconductor element such as a nonvolatile semiconductor memory.

According to the first method, defects in lattice are able to lessen because shortage of oxide is rare owing to the oxide including in the film forming material as an element of the silicon compound. According to the second method, defects in lattice are able to be mended because oxide elements are supplied to the unbonded pairs owing to anneal in oxide atmosphere. According to the third method, defects in lattice are able to lessen because the surface of the substrate is able to keep plain owing to prevention of natural oxidation in the peripheral region of the substrate.

Since the present invention adopted either method of using silicon compound consisted of oxygen atom as film forming material, annealing in the atmosphere of sparse oxygen gas after deposition, and keeping the temperature of circumstance where the wafer left before deposition as low as the minimum temperature which can cause thermal oxidation; lattice defects in silicon oxide film can be decreased and dielectric strength can be enhanced. Therefore, leak currents of isolation film in various semiconductor device can be prevented. Consequently, the reliability of device, especially nonvolatile semiconductor memory can be increased.

DESCRIPTION OF THE PREFERRED EMBODIMENTS

The embodiments preferred by the inventor of the present invention will be now described with reference to the accompanying drawings hereinafter.

Embodiment 1

Each process of producing a nonvolatile memory according to the method of the present invention will be described referring to FIG. 1 to FIG. 8.

A floating gate of a nonvolatile memory is formed by the method of Local Oxidation of Silicon in this embodiment. At first, a local oxide film is formed in FIG. 1 to FIG. 4.

Figure 1:
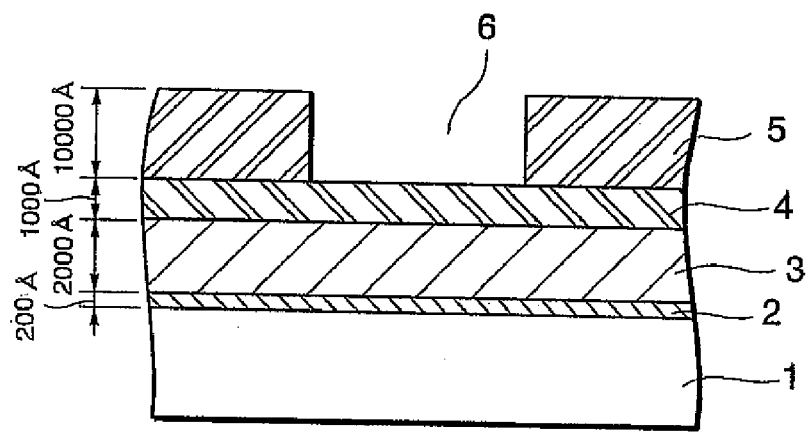
FIG. 1 is a cross-sectional side view of a single semiconductor memory cell in the process of preparing to form a local oxide film.

The process of preparing to form a local oxide film will be described according to FIG. 1. As some processes before the process in FIG. 1, at first, the surface of a p-type silicon substrate is dry-oxidized so as to form the first oxide film 2 of $SiO_2$ which thickness is 200 Å (20 nm). After this, a poly silicon film 3 is formed on the surface of the first oxide film 2 with the thickness of 2000 Å. And, an oxidation stopping film 4 of $Si_3N_4$ is formed with the thickness of 1000 Å. Besides, a resist 5 is spread with thickness of 1 μm, then, the resist 5 is exposed to light with a stepper. And, an opening 6 is formed by developing this resist 5. Then, completes the preparation of forming a local oxide film located on a floating gate.

Figure 2:
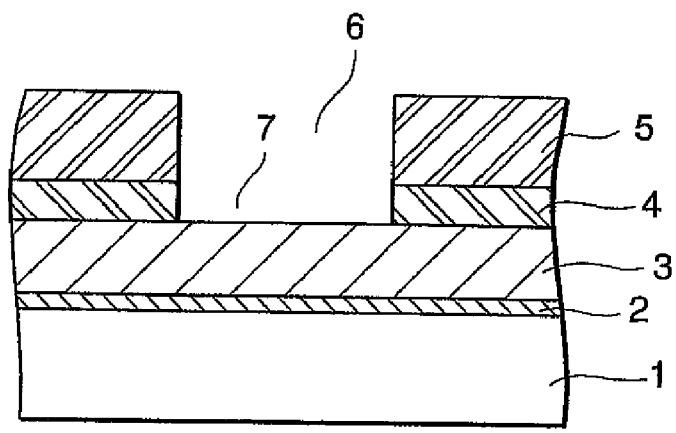
FIG. 2 is a similar view of the same cell in FIG. 1 in the process of starting to form a local oxide film.

The process of starting to form a local oxide film will be described according to FIG. 2. As shown in FIG. 2, an opening portion 7 is formed by dry-etching the oxidation stopping film 4 exposed through the opening 6. The condition of etching is, for example; $CFH_3$ and $O_2$, 75 SCCM and 25 SCCM respectively supplied in an etching chamber not shown in the drawings; the pressure there, 70 mTorr. In addition, SCCM means stream supplying each minute.

Figure 3:
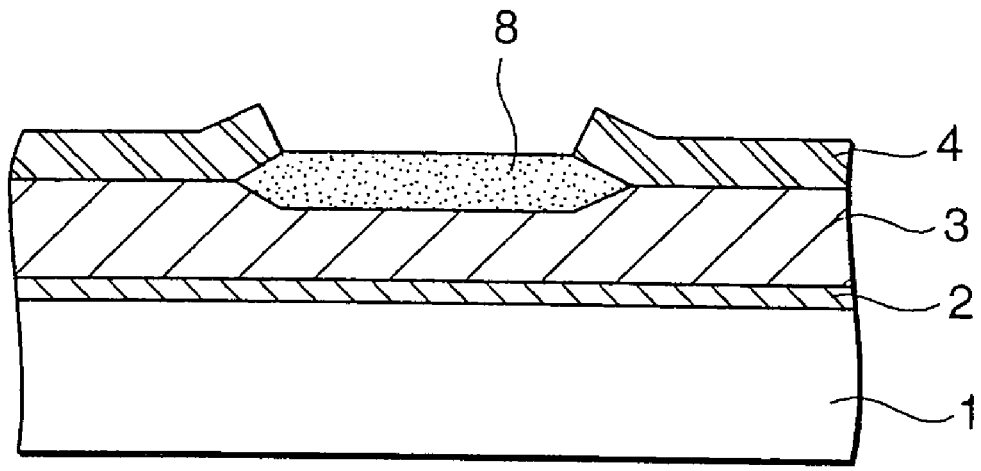
FIG. 3 is a similar view of the same cell in the process of ending to form a local oxide film.

The process of completing to form a local oxide film is described according to FIG. 3. To come to this process, after removed is the resist 5, the poly silicon film 3 is local-oxidized through the opening portion 7. Thus, a local oxide film 8 of $SiO_2$ is formed with the thickness of 1500 Å to 2000 Å.

Figure 4:
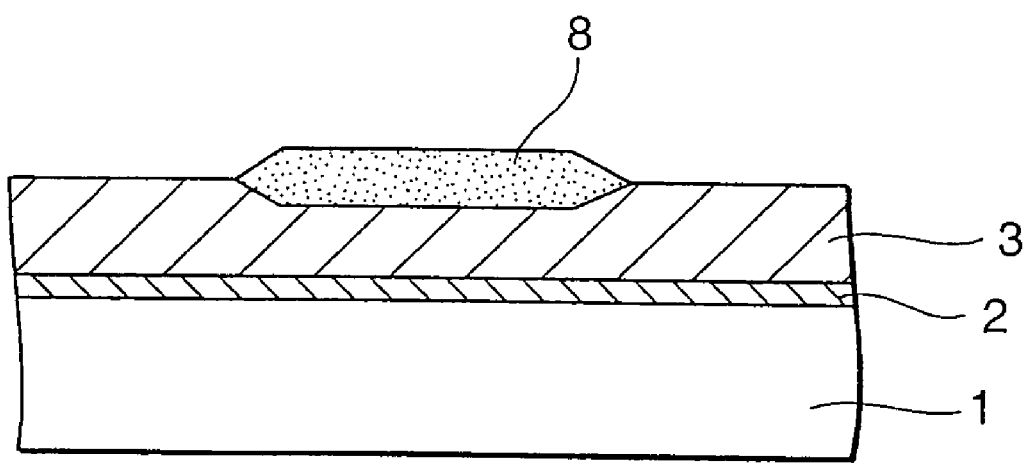
FIG. 4 is a similar view of the same cell in the process of completing to form a local oxide film.

The process of completing to form a local oxide film is described according to FIG. 4. This is processed by removing oxidation stopping film 4 with hot phosphoric acid.

Figure 5:
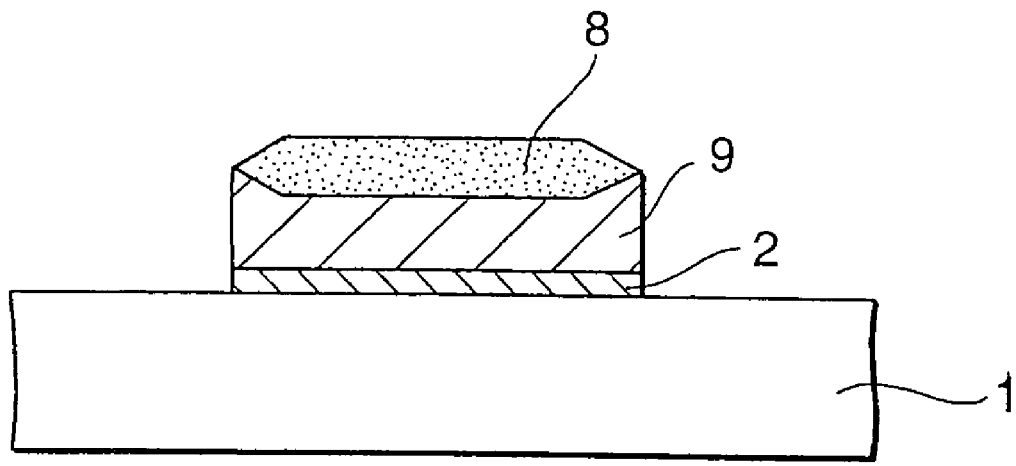
FIG. 5 is a similar view in the process of forming a floating gate.

The process of forming a floating gate is described according to FIG. 5. The forming of a floating gate is processed by etching the poly silicon film 3 vertically with the mask of a local oxide film 8. As a result, a floating gate 9 is formed by removing poly silicon 3 and the first oxide film except the portion of those under the local oxide film 8. The condition of etching is, for example; HBr and $Cl_2$, 50 SCCM and 200 SCCM respectively as reaction gas supplied in an etching chamber not shown in the drawings; the pressure there, 150 mTorr. After this, to remove the damaged layer on the silicon substrate 1 by etching, for example, with a cleaning liquid of HF type, cleaned is the surface of the silicon substrate 1.

Figure 6:
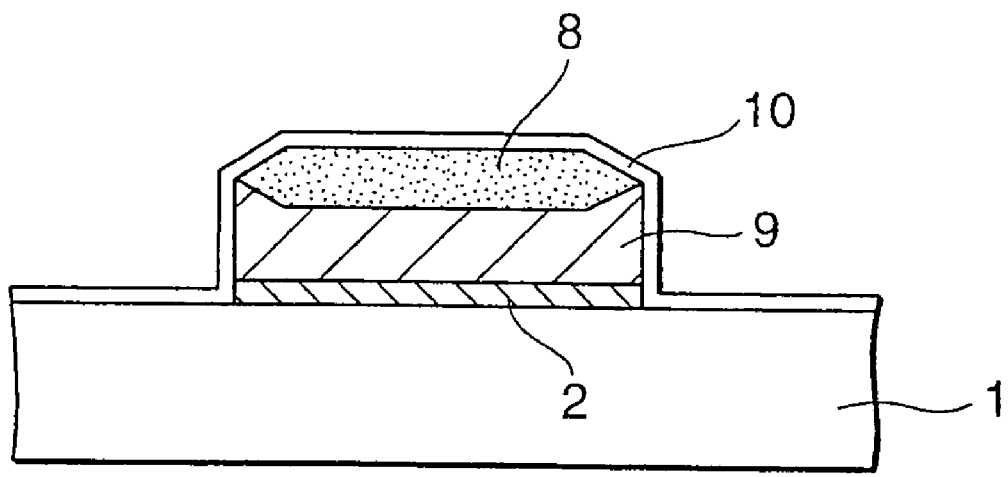
FIG. 6 is a similar view in the process of forming a tunnel oxide film.

The process of forming a tunnel oxide film is described according to FIG. 6. This is processed by low pressure CVD method with tetra-ethyl ortho-silicate, the abbreviation TEOS, as a material of film forming.

This silicon compound creates $SiO_2$ by thermal resolving reaction of $Si(OC_2H_5)_4 \rightarrow SiO_2 + 4C_2H_4 + 2H_2O$. The condition of film forming; as for the best condition; the temperature, 650° C.; the pressure 0.40 Torr (53.39 Pa). This condition is, as for the temperature, allowed is a range of ±5° C. That is, the temperature range allowed is 645° C. to 655° C. Under 655° C., controlling the forming of film, the thin film is able to be formed in a stable condition. On the other hand, beyond 645° C., the uniformity of the surface of film formed is kept in a good condition. Therefore, to satisfy both of these conditions, the temperature range mentioned above is selected. Moreover, as for the condition of pressure, allowed is a range of ±0.01 Torr (1.33 Pa). That is, the pressure range allowed is 0.39 Torr to 0.41 Torr. Within this pressure range, the thin film is formed in a stable condition spending sufficient time for controlling film forming, and the uniformity of the surface of film formed is kept in a good condition.

Under the condition of these temperature and pressure, TEOS gas of 200 cc each minute is supplied. This gas stream supplied is enough to fill the chamber of CVD device, and the range allowed is 198 to 202 cc. With sufficient TEOS gas under the condition of these temperature and pressure, CVD oxide film of 20 Å each minute is formed. As a result of film forming under the condition mentioned above, the second oxide film 10 with high dielectric strength is formed all over the side wall of floating gate 9 and the upper surface of local oxide film 8. This is achieved with TEOS, though the temperature is 650° C. which is lower than the conventional CVD temperature of 750° C.

In addition, the allowed time for leaving the wafer in the clean room before it is carried in the CVD device is less than about 8 hours. Because, the uniformity of surface of the film becomes likely to be ruined owing to invasion of fine flying object filled in the clean room, when the wafer is left over the time of about 8 hours.

Figure 7:
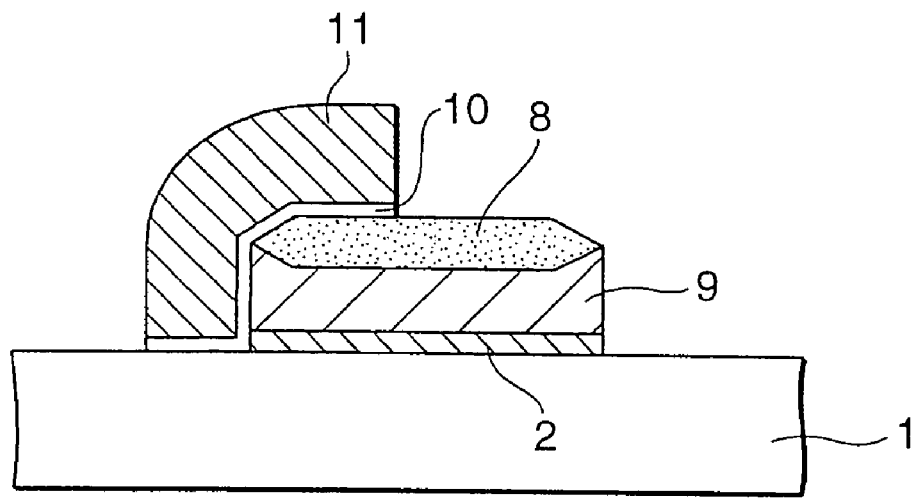
FIG. 7 is a similar view in the process of forming a control gate.

The process of forming a control gate is described according to FIG. 7. Before coming to the process shown in FIG. 7, at first, a poly silicon film is formed all over the surface of element shown in FIG. 6 by low pressure CVD method. And, this poly silicon film is changed into n-type silicon with POC13 liquid source. After this, by patterning this film, remained are the local oxide film 8, the floating gate 9 and a portion of the silicon substrate 1. Thus, a control gate 11 is formed with the poly silicon film patterned in the manner mentioned above. In this patterning, the portion of the second oxide film 10 except the portion under the patterned poly silicon film is removed with the removing portion of poly silicon film.

Figure 8:
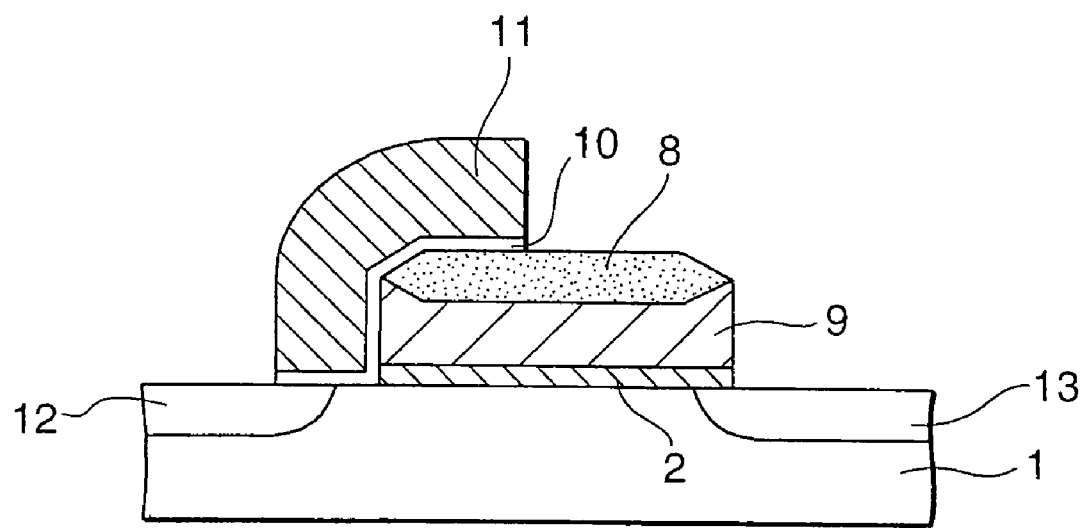
FIG. 8 is a similar view in the process of forming a source and a drain.

The process of forming a source and a drain is described according to FIG. 8. This is what is formed an extension region of impurities for a source and a drain, which is performed by introducing n-type impurity such as phosphorus etc. into the silicon substrate 1 region locating at both sides of the floating gate 9 and the control gate 11.

Figure 9:
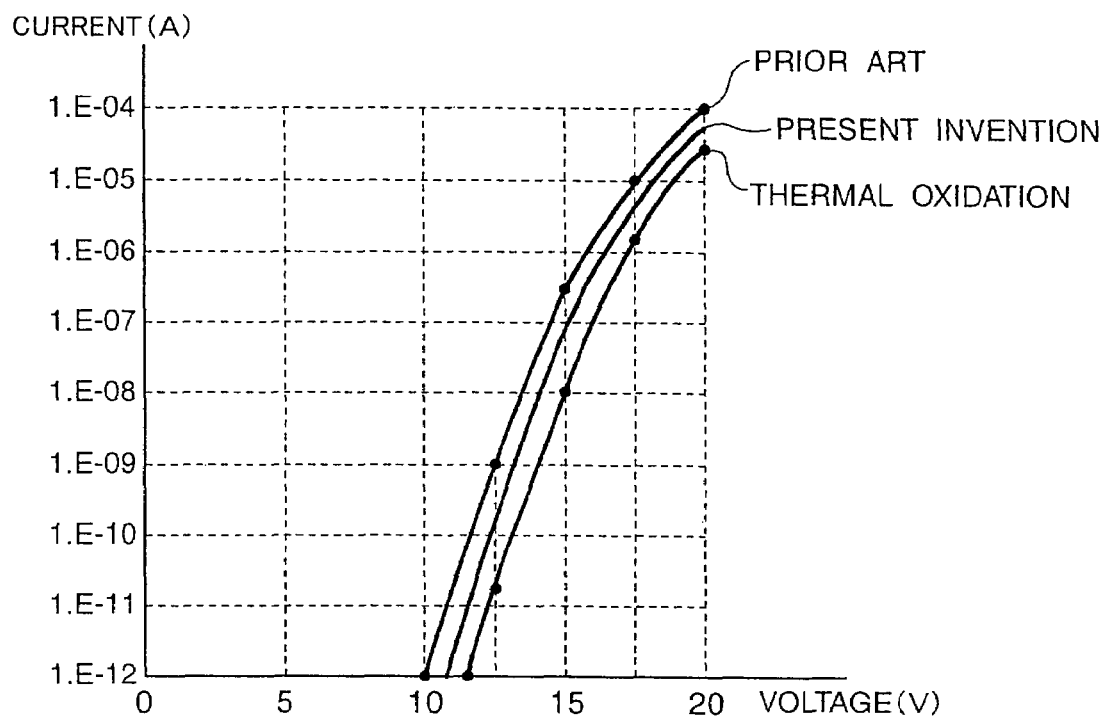
FIG. 9 shows the result of dielectric strength test.

Although, a nonvolatile semiconductor memory cell is produced by the method mentioned above according to Embodiment 1 of the present invention, the inventor prepared a sample of he second oxide film 10 as well as the conventional testing method mentioned before. And, he tested the sample so as to evaluate the dielectric strength of the tunnel oxide film which consists in the cell. The result of the test is shown in FIG. 9. The testing method is, as well as the conventional way, the voltage impressed to the sample which thickness of about 100 Å was gradually increased from 0V and a leak current was measured.

As shown in FIG. 9 at the same voltage, each leak current of the tunnel oxide film of the present invention is less than that of the conventional tunnel oxide film. That is, as for the tunnel oxide film of the present invention, it has been convinced that the dielectric strength of it has come near to the dielectric strength 12 MV/cm of thermal oxide film. So, with this tunnel oxide film, we have got a result that the charge holding of the floating gate 9 has been still improved and that reliability of device become higher. Moreover, Si $(OC_2H_5)_4$ adopted as an atmosphere of vapor deposition has made the process efficiency of deposition about three times better than $SiH_4 + N_2O$. For example, the same device which is able to process film forming of the tunnel oxide film on 50 wafers per a batch has become able to process 150 wafers per a batch. Thus, we also have got a secondary result that the process ability of the tunnel oxide film forming has been increased and that this can contribute to the improvement of throughput for over all production.

The inventor considers these results as those caused from next. Although the mixture gas of $SiH_4$ and $N_2O$ was used as a film forming material in the conventional method, $N_2O$ needed the process temperature of about 900° C. to complete thermal resolution. But, the process temperature usually used in the conventional method was 750° C. Therefore, $N_2O$ and $SiH_4$ did not react completely. So, it has been conceived that there are many Si- which is not coupled with O. These uncoupled Si-causes lattice defects in the tunnel oxide film. And electrons are trapped there. As a result, a leak current is caused at comparatively low voltage. On the other hand, as for $Si(OC_2H_5)_4$ gas, $SiO_2$ is obtained by the thermal resolution reaction of $Si(OC_2H_5)_4 \rightarrow SiO_2 + 4C$. So, it has been conceived that the uncoupling of Si-with O is not likely to occur.

Figure 10:
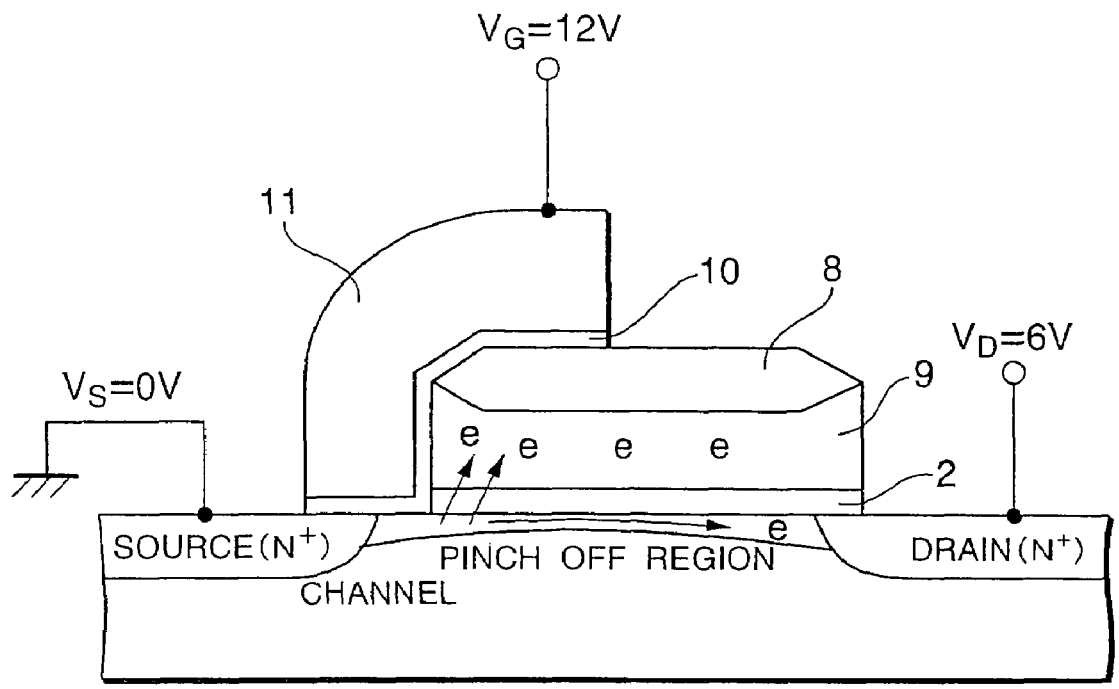
FIG. 10 shows the operation to write in the memory.

Next, the operation of the nonvolatile semiconductor memory produced by the method mentioned above will be described. FIG. 10 shows the operation in occasion of writing in the memory. As shown in FIG. 10 impressed the gate voltage VG (e.g. 12V), opened the channel from source to drain, source is earthed (0V) and drain is impressed with the voltage VD (e.g. 6V). In this occasion, as the gate voltage VG is set higher than the drain voltage VD, the electric field orienting from gate to source becomes higher than the electric field orienting from drain to source. Consequently, electrons are injected in floating gate 9 by what is called a channel injection from source via channel and the first oxide film 2 that is thermal oxide film. In this occasion, the dielectric strength of the second oxide film 10 that is tunnel oxide film has become enhanced. So, the electrons lost energy by passing through the first oxide film 2 seldom pass through the second oxide film 10.

Figure 11:
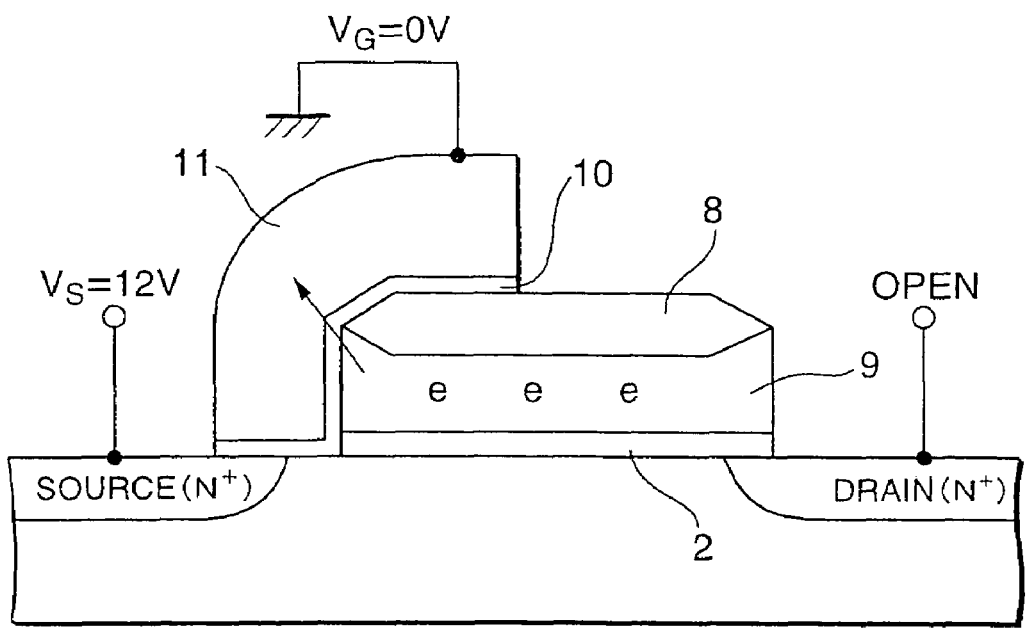
FIG. 11 shows the operation to erase data in the memory.

FIG. 11 shows the operation in occasion of erasing data in memory. As shown in FIG. 11, impressed is the source voltage VS (e.g. 12V), the gate is earthed (0V) and drain is left open, in occasion of erasing data. Consequently, tunnel current flows in control gate 11 from floating gate 9 via tunnel oxide film that is the second oxide film 10 located between floating gate 9 and control gate 11. Besides, tunnel current flows in source from control gate 11 via tunnel oxide film that is the second oxide film 10 located between control gate 11 and source. Thus, data is erased.

In occasion of writing data again, as shown in FIG. 10, source is earthed (0V) and drain is impressed with voltage VD (e.g. 6V). But, as for the memory cell not selected, control gate 11 is earthed (0V). In this occasion, the dielectric strength of tunnel oxide film that is the second oxide film 10 located between control gate 11 and floating gate 9. So, tunnel current never flows, that is, electrons never enters in floating gate 9 from the earthed portion via control gate 11 and the second oxide film 10. Therefore, writing error is prevented.

Embodiment 2

Next, the second embodiment of the present invention will be described. Embodiment 2 is also concerned to production of nonvolatile semiconductor memory as well as Embodiment 1. So, the majority of producing processes are common to both embodiments. Therefore, FIG. 1 to FIG. 8 as well as Embodiment 1 will be referred in Embodiment 2. Hereinafter, described are only different processes.

As for Embodiment 2, the process of its tunnel oxide film forming is different from Embodiment 1. Therefore, the description according to FIG. 6 is different. In FIG. 6, the film forming material of tunnel oxide film used is same as the conventional materials. These are monosilane $SiH_4$ and nitric oxide $N_2O$, one of which does not include an oxygen atom and the other of which does include an oxygen atom. The condition of film forming is, as mentioned before; the temperature, 750° C.; the pressure 0.45 Torr; the atmosphere $SiH_4 : N_2 = 24 : 1200$ cc.

And, after the film forming, taken out the wafer from the CVD device, taken in the furnace, the tunnel oxide film formed is annealed. In this occasion, the allowed time for leaving the wafer in the clean room taken out from the CVD device is less than 8 hours. If left more than that time, some fine flying organic objects in the clean room invades in the film. And, this is likely to deteriorate the surface uniformity of the film. The best condition of annealing is the temperature, 900° C.; the atmosphere, the mixture gas of 1% $O_2$ and 99%

N2. The oxidation in this annealing is caused only by O2 excluding H2O. So, this is what is called dried oxidation. The range of oxygen density allowed is 0.8 to 1.0%. The processing time is 15 minutes, allowed ±1 minute range. In these conditions, oxygen atoms are got only into the portion of film where crystal defects are caused. So, the thickness of the film does not increase. Consequently, the second oxide film 10 with high dielectric strength is formed all over the side wall of floating gate 9, the upper surface of local oxide film 8 and the surface of silicon substrate 1. The other producing processes are same as those of Embodiment 1. Therefore, the description according to FIG. 1 to FIG. 5 and FIG. 7, FIG. 8 is same, and the same description is omitted.

As for the tunnel oxide film formed according to Embodiment 2, the inventor of present invention prepared a sample which thickness is about 100 Å and which sectional area is 0.02 mm2, so as to conduct the life test and C-V (capacity-voltage) characteristic test. The result of each test is shown in FIG. 12 and FIG. 13 respectively.

Figures 12A, 12B:
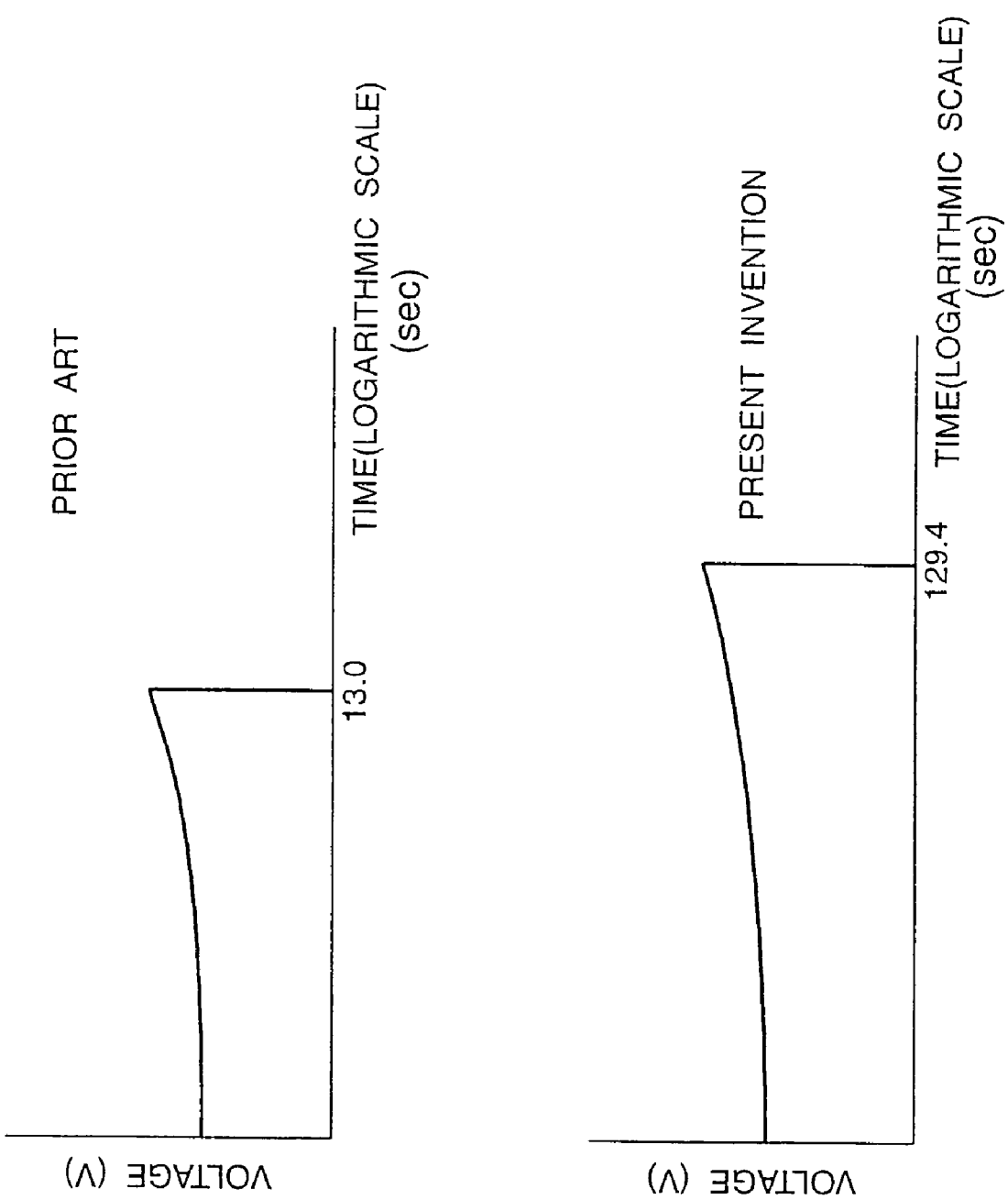
FIGS. 12(a) and 12(b) show the results of longevity test of semiconductor element.

FIGS. 12(*a*) and 12(*b*) show the life time parameters of the films, comparing what has been annealed by the method of Embodiment 2 of present invention with what has been annealed by the conventional method. To mention the method of the life test briefly, the prescribed numbers of electrodes are made contact with the portions of the prescribed area on the oxide film sample formed flat. And, 4.E-5A of a strong current for the semiconductor element is continued to flow controlling in the uniform strength. Meanwhile, the impressed voltage goes down to 0V. And, measured is the time from when a voltage impressed that is the current begun to flow until when the drop in voltage occurred. This measured time is regarded as a parameter of life. Some of the prepared samples are poor. So, good prescribed numbers of samples are prepared for measuring prescribed numbers of times, so as to obtain the average time as a result of test. These methods are known well, so further descriptions are omitted.

As for what was annealed after film forming according to the conventional method, dropped was the impressed voltage at the time of 13.0 sec. The impressed voltage at the time, that is dielectric break down voltage, was 4.2V. Therefore, the dielectric strength was 4.2V÷100 Å=4.2 MV/cm. On the other hand, as for what was annealed after film forming according to Embodiment 2, dropped was the impressed voltage at the time of 129.4 sec. The impressed voltage at the time, that is dielectric break down voltage, was 3.6V. Therefore, the dielectric strength was 3.6V÷100 Å=3.6 MV/cm. As shown in FIGS. 12(*a*) and 12(*b*), according to the present invention the life time has become ten times longer than that of the conventional art. In addition, the time of the horizontal coordinate in the graph has a logarithmic scale. By the way, the dielectric strength of Embodiment 2 has become weaker than that of the conventional method at each break down point. It has been convinced that this phenomenon was caused from the large number of charges accumulated in the longer flowing time.

Figure 13A:
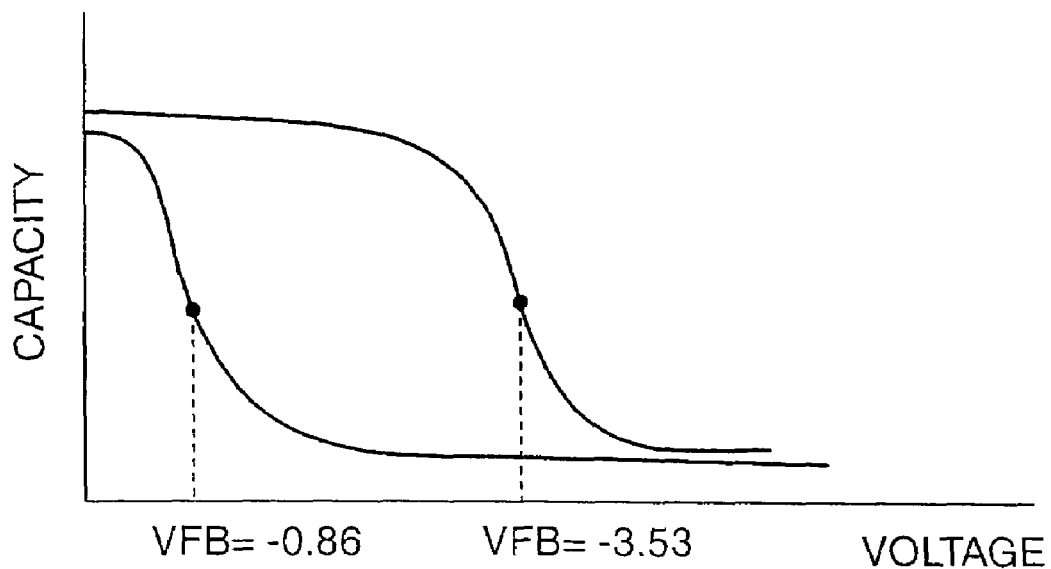
FIGS. 13(a) and 13(b) show the results of C - V characteristic test.
Figure 13B:
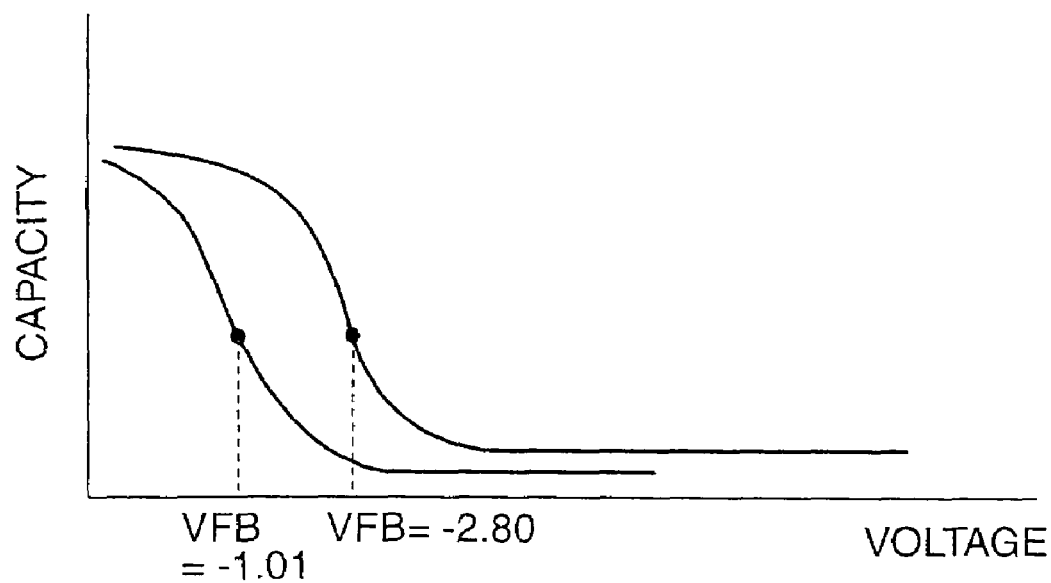

FIGS. 13(*a*) and 13(*b*) show the C-V characteristic of what was produced by Embodiment 2 of the present invention comparing with that of what was produced by the conventional method. The brief description of C-V (capacity-voltage) characteristic test is presented next. Contacted an electrode at the portion of area 0.02 mm2 of the oxide film sample formed, impressed a bias voltage with the electrode, alternated the voltage in a prescribed range of it, the charge density of the surface of the film that represents the capacity of the film is measured. The result of this measurement is shown by the curves in FIGS. 13(*a*) and 13(*b*).

Next, a prescribed current flow is loaded to the sample. That is, a prescribed strength of current flowed through the electrode for a prescribed length of time. If there are some crystal defects in the sample, after this current flow load, positive holes are accumulated in these defects and the curve of the C-V characteristic changes its shape. Let us see the actual operation of nonvolatile semiconductor memory at this point of view. Writing data in and deleting data in a nonvolatile memory is performed by the passing of a group of electrons through the tunnel oxide film. So, a certain period while the electric device installed nonvolatile memory is used corresponds to the times of the passing of electrons through tunnel oxide film. And this is the current flow load of tunnel oxide film, which corresponds to the current flow load of C-V characteristic test.

If there are some crystal defects in the tunnel oxide film, positive holes are trapped there. The more times of writing data in and delete data in memory are performed, the more positive holes are trapped. If positive holes are kept trapped, the tunnel oxide film wears positive charge. So, this attracts electrons. Thus, a leak current flows. As the number of the positive holes trapped increases, the strength of the leak current increases. At last, dielectric break down occurs. In these processes, the end of the life of semiconductor element comes. By the way, the number of the positive holes trapped is larger when the number of the crystal defects is larger. So the more crystal defects are in an element, the shorter the life of the element becomes.

Therefore, by examining the change of the C-V characteristic curve, the life of an element is able to be evaluated. That is; the more the curve changes; the more the crystal defects, the shorter the life and the poor the durability the element has. The change in C-V characteristic is examined by the change in flat band voltage VFB of the sample semiconductor. The method of C-V characteristic test is also known well. So, further description than this is omitted. According to the present invention, the flat band voltage before and after the current flow load were −0.86V and −3.53V respectively. And, the difference was −2.67V. On the other hand, those of the conventional art were −1.01V and −2.80V respectively. And the difference was −1.79V. Therefore, as shown in FIGS. 13(*a*) and 13(*b*), according to the present invention, the change in C-V characteristic is about 67% as compared with that of the conventional art. The horizontal coordinate in graph has a logarithmic scale.

As a result of these test, it has been conceived that according to Embodiment 2 of the present invention a considerable amount of crystal defects are mended by the annealing in the sparse oxygen atmosphere after film forming, comparing with the conventional art. So, the extension of life and the improvement of dielectric strength are achieved by the decrease of hole trap number. Thus, high quality nonvolatile memory has become to be provided.

Embodiment 3

Next, Embodiment 3 of the present invention will be described. Embodiment 3 is also concerned to production of nonvolatile memory as well as Embodiment 1 and 2. So, the most of the producing processes are common. Therefore, FIG. 1 to FIG. 8 are referred as well as Embodiment 1 and 2. Embodiment 3 is also different from Embodiment 1 only in the process of forming tunnel oxide film as well as Embodiment 2. So, it is different only in description of FIG. 6.

Figure 14:
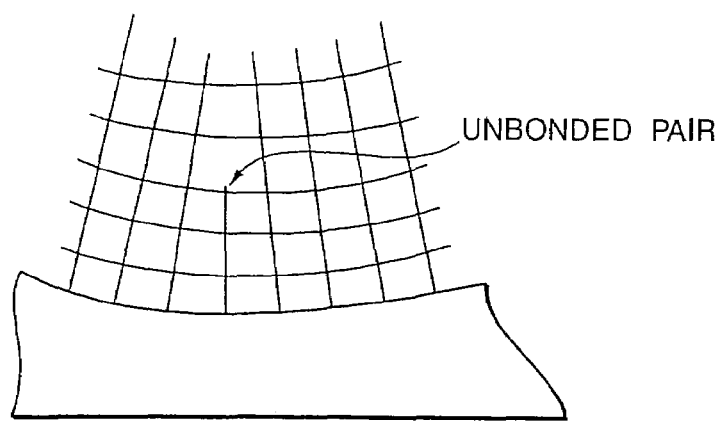
FIG. 14 shows a forming state of a crystal.

In the process of forming of tunnel oxide film described in FIG. 6 according to the conventional art and the other embodiments, the initial temperature that is the wafer loading temperature of the chemical vapor deposition device was got down to the maximum temperature (about 600° C.) where chemical vapor deposition is not able to start. But, thermal oxidation occurs at the temperature lower than this maximum temperature. Therefore, the natural oxidation occurs on the wafer surface, unless chemical vapor deposition is started by heating up as soon as the wafer is loaded. This natural oxidation does not occur uniformly on the wafer surface but is likely to occur on the peripheral portion of the wafer. As a result, as shown in FIG. 14, the surface where chemical vapor deposition starts is not flat, and lattice defects are likely to occur when the lattice is deposited to the vertical direction of the surface.

Consequently, according to Embodiment 3, the initial temperature is got down to the minimum temperature (about 400° C.) where thermal oxidation of silicon occurs. The temperature lower than this minimum temperature is not preferable because the throughput of the device becomes decreased, though the natural oxidation is certainly prevented. Moreover, getting down to lower than this minimum temperature is threatened to deteriorate the production circumstances. That is, film forming material gas is solidified and sticked to the inner wall and ceiling of the CVD device. In this circumstance, solidified material is likely to peel off from the ceiling when the device is heated up for deposition. And these materials solid can drop on the wafer. Consequently, also for the purpose of preventing this, the minimum temperature (about 400° C.) has been prescribed. In addition, it has been conceived that this minimum temperature may also be selected from the range of about +5° C. around 400° C.

The same method of Embodiment 3 of the present invention is applied not only to the film forming of the conventional method, but also to the film forming with TEOS of Embodiment 1 and with annealing after film forming of Embodiment 2. When TEOS is adopted as film forming material according to Embodiment 1, CVD temperature becomes 650° C. Therefore, the heating up time from wafer loading to CVD starting can be shortened, comparing with CVD temperature of 750° C. in Embodiment 3 or convention. This is preferable for keeping uniformity of the starting surface of deposition because the thermal oxidation is prevented. Moreover, crystal defects likely to occur during deposition are considerably decreased owing to the TEOS characteristics mentioned before. As these mutual effects mentioned above are obtained, it has been conceived collectively that the supreme is the method of using material of Embodiment 1 under the temperature control of Embodiment 3. The inventor examined the film forming condition of samples formed according to Embodiment 3. And, next effect has been obtained. These samples were formed by preparing silicon materials of the same size. And, at the initial temperature of the present invention and the conventional art respectively, writing for the same time. Then, the samples were deposited. And, the uniformity in same prescribed size of each sample area were examined. The film forming material was mixture gas of SiH4 and N2O. The film forming condition is the temperature, 750° C.; the pressure, 0.45 Torr; the atmosphere SiH4:N2O=24:1200 cc. As a result, as for the convention (about 600° C.), the existence rate of the areas with not uniform level per total areas was about 3.5%. On the other hand, as for the present invention (about 400° C.), that was improved to about 2.7%. Therefore, the uniformity of CVD starting surface has been improved about 20%. Consequently, according to Embodiment 3, crystal defects which can occur in producing semiconductor element have been decreased. Thus, it has been convinced that high efficiency nonvolatile semiconductor memory can be provided.

It goes without saying that the present invention is not limited to the embodiments mentioned above. It can be changed to various forms in the scope of the present invention. For example, the method of forming tunnel oxide film of nonvolatile semiconductor memory is described in the embodiments mentioned above. The method of the present invention is utilized not only to this but also to forming intermediate isolation film for multi-layered wiring.

What is claimed is:

1. A method of producing a semiconductor element comprising:
   a process of forming a first oxide film on a semiconductor substrate,
   a process of forming a semiconductor film and an oxidation stopping film on the first oxide film,
   a process of forming an opening by patterning the oxidation stopping film,
   a process of forming an insulating local oxide film by local oxidation of a surface of the semiconductor film exposed through the opening,
   a process of removing the oxidation stopping film,
   a process of forming a floating gate of the semiconductor film remaining under the insulating local oxide film, by selective etching of the semiconductor film masked with the insulating local oxide film,
   a process of cleaning the semiconductor substrate, and
   a process of transferring the silicon substrate with the floating gate to a chemical vapor deposition device where an initial temperature is kept in a range where oxidation of a surface of the floating gate is restrained,
   a process of heating the chemical vapor deposition device from the initial temperature to a chemical vapor deposition temperature, and
   a process of forming a second oxide film covering the floating gate by low pressure chemical vapor deposition,
   wherein the initial temperature is in range of 400° C.±5° C. and the chemical vapor deposition temperature is in range of 750° C.±5° C.

2. A method of producing a semiconductor element comprising:
   a process of forming a first oxide film on a semiconductor substrate,
   a process of forming a semiconductor film and an oxidation stopping film on the first oxide film,
   a process of forming an opening by patterning the oxidation stopping film,
   a process of forming an insulating local oxide film by local oxidation of a surface of the semiconductor film exposed through the opening,
   a process of removing the oxidation stopping film,
   a process of forming a floating gate of the semiconductor film remaining under the insulating local oxide film, by selective etching of the semiconductor film masked with the insulating local oxide film,
   a process of cleaning the semiconductor substrate, and
   a process of transferring the silicon substrate with the floating gate to a chemical vapor deposition device where an initial temperature is kept in a range where oxidation of a surface of the floating gate is restrained,
   a process of heating the chemical vapor deposition device from the initial temperature to a chemical vapor deposition temperature,
   a process of forming a second oxide film covering the floating gate by low pressure chemical vapor deposition, and a process of annealing the second oxide film in a sparse oxygen atmosphere, after the process of forming the second oxide film, wherein the initial temperature is in range of 400° C.±5° C. and the chemical vapor deposition temperature is in range of 750° C.±5° C.

3. A method of producing a semiconductor element comprising:

a process of forming a first oxide film on a semiconductor substrate, a process of forming a semiconductor film and an oxidation stopping film on the first oxide film, a process of forming an opening by patterning the oxidation stopping film, a process of forming an insulating local oxide film by local oxidation of a surface of the semiconductor film exposed through the opening, a process of removing the oxidation stopping film, a process of forming a floating gate of the semiconductor film remaining under the insulating local oxide film, by selective etching of the semiconductor film masked with the insulating local oxide film, a process of cleaning the semiconductor substrate, and a process of transferring the silicon substrate with the floating gate to a chemical vapor deposition device where an initial temperature is kept in a range where oxidation of a surface of the floating gate is restrained, a process of heating the chemical vapor deposition device from the initial temperature to a chemical vapor deposition temperature, a process of forming a second oxide film covering the floating gate by low pressure chemical vapor deposition, wherein tetra-ethyl ortho-silicate is formed in the process of forming the second oxide film, and wherein the initial temperature is in range of 400° C.±5° C. and the chemical vapor deposition temperature is in range of 750° C.±5° C.

* * * * *